United States Patent
Ebner et al.

(10) Patent No.: US 10,663,497 B2
(45) Date of Patent: May 26, 2020

(54) METHOD AND SYSTEM FOR AUTOMATED ASSOCIATION OF DEVICES WITH ELECTRICITY METERS

(71) Applicant: Xerox Corporation, Norwalk, CT (US)

(72) Inventors: Fritz Francis Ebner, Pittsford, NY (US); Shu Chang, Pittsford, NY (US)

(73) Assignee: Xerox Corporation, Norwalk, CT (US)

( * ) Notice: Subject to any disclaimer, the term of this patent is extended or adjusted under 35 U.S.C. 154(b) by 2003 days.

(21) Appl. No.: 14/021,306

(22) Filed: Sep. 9, 2013

(65) Prior Publication Data

US 2015/0073736 A1    Mar. 12, 2015

(51) Int. Cl.
| | |
|---|---|
| G01R 21/06 | (2006.01) |
| G01D 9/02 | (2006.01) |
| G01D 21/00 | (2006.01) |
| G06F 17/40 | (2006.01) |
| G06F 19/00 | (2011.01) |
| G01R 21/133 | (2006.01) |
| G06F 11/30 | (2006.01) |
| G01D 4/00 | (2006.01) |

(52) U.S. Cl.
CPC .......... *G01R 21/133* (2013.01); *G01D 4/002* (2013.01); *G01D 21/00* (2013.01); *G06F 11/3051* (2013.01); *G01D 9/02* (2013.01); *G01R 21/06* (2013.01); *G06F 17/40* (2013.01); *G06F 19/00* (2013.01); *Y02B 90/241* (2013.01); *Y02B 90/246* (2013.01); *Y04S 20/32* (2013.01); *Y04S 20/38* (2013.01); *Y04S 20/42* (2013.01); *Y04S 20/48* (2013.01)

(58) Field of Classification Search
None
See application file for complete search history.

(56) References Cited

U.S. PATENT DOCUMENTS

| | | | | |
|---|---|---|---|---|
| 4,120,031 A | * | 10/1978 | Kincheloe | G06Q 20/342 |
| | | | | 235/432 |
| 4,803,632 A | * | 2/1989 | Frew | G01D 4/006 |
| | | | | 340/12.32 |
| 5,930,773 A | * | 7/1999 | Crooks | G06Q 10/06 |
| | | | | 705/30 |

(Continued)

FOREIGN PATENT DOCUMENTS

| | | | |
|---|---|---|---|
| JP | 2008-1488 A | * | 1/2008 |
| JP | 2008-26104 A | * | 2/2008 |

*Primary Examiner* — Michael J Dalbo
(74) *Attorney, Agent, or Firm* — Fox Rothschild LLP

(57) ABSTRACT

A system, method and device for automated association of a device and a power meter. For example, the method includes determining a power profile for a power meter, determining device-specific power information for each of a plurality of devices, comparing the device-specific power information for each of the plurality of devices against the power profile for the power meter, determining, based upon the comparing, which of the plurality of devices is associated with the power meter, and recording the power meter and its associated device in a network management record. The techniques may be extended to include associating multiple multifunction print devices to one of a plurality of power meters based upon power log and job arrival information for the print devices as compared to power profile information from the power meters, thereby providing for automated associated of the devices and the power meters without unnecessary human interaction.

12 Claims, 8 Drawing Sheets

(56) References Cited

U.S. PATENT DOCUMENTS

| | | | | |
|---|---|---|---|---|
| 5,943,656 A * | 8/1999 | Crooks | G06Q 20/04 | 705/30 |
| 6,049,791 A * | 4/2000 | Lerner | G06Q 30/04 | 324/115 |
| 6,052,671 A * | 4/2000 | Crooks | G06Q 20/04 | 702/61 |
| 6,088,688 A * | 7/2000 | Crooks | G06Q 10/06 | 702/61 |
| 6,633,823 B2 * | 10/2003 | Bartone | H02J 3/14 | 700/295 |
| 7,135,956 B2 * | 11/2006 | Bartone | H02J 3/14 | 340/3.9 |
| 8,447,541 B2 * | 5/2013 | Rada | G05F 1/70 | 62/130 |
| 8,560,134 B1 * | 10/2013 | Lee | H02J 13/0086 | 700/28 |
| 9,020,769 B2 * | 4/2015 | Rada | G01D 4/00 | 702/176 |
| 2002/0072868 A1 * | 6/2002 | Bartone | H02J 3/14 | 702/62 |
| 2004/0078153 A1 * | 4/2004 | Bartone | H02J 3/14 | 702/57 |
| 2006/0289553 A1 * | 12/2006 | Ehlers | G07F 9/026 | 221/9 |
| 2008/0080625 A1 * | 4/2008 | Miyata | H04B 3/542 | 375/257 |
| 2009/0312969 A1 * | 12/2009 | Sundaresh | G06Q 50/06 | 702/62 |
| 2010/0070217 A1 * | 3/2010 | Shimada | H02J 13/0062 | 702/62 |
| 2010/0174419 A1 * | 7/2010 | Brumfield | G01R 22/10 | 700/295 |
| 2010/0191487 A1 * | 7/2010 | Rada | G05F 1/70 | 702/60 |
| 2010/0283577 A1 * | 11/2010 | Koch | G01D 4/002 | 340/5.2 |
| 2011/0251807 A1 * | 10/2011 | Rada | G01D 4/00 | 702/61 |
| 2012/0166115 A1 * | 6/2012 | Apostolakis | G06Q 50/06 | 702/62 |
| 2013/0051375 A1 * | 2/2013 | Chemishkian | H04W 84/18 | 370/338 |
| 2013/0332001 A1 * | 12/2013 | Parello | G06F 1/3209 | 700/295 |
| 2014/0002055 A1 * | 1/2014 | Costa | G06F 11/3006 | 324/76.11 |
| 2014/0214729 A1 * | 7/2014 | Lin | G06Q 50/06 | 705/412 |
| 2014/0358456 A1 * | 12/2014 | Du | G01R 21/06 | 702/60 |

* cited by examiner

METHOD AND SYSTEM FOR AUTOMATED ASSOCIATION OF DEVICES WITH ELECTRICITY METERS

BACKGROUND

The present disclosure relates to methods and systems for measuring power consumption. More specifically, the present disclosure relates to automated association of power consuming devices with electricity meters.

Energy consumption reporting and control for a device, such as an office device, is becoming more interesting to consumers. As electricity becomes more expensive, and consumers strive to become more environmentally conscious, accurate power consumption and modeling is becoming more important.

Many companies operate large number of office devices such as printers, copiers and multifunction devices (e.g., a single device capable of scanning, printing, faxing and/or copying) at a single time, and would like to accurately model or measure the power consumption at each device, or the power consumed at groups of the devices. Existing techniques for energy modeling or measurement use a variety of methods, each having differing accuracy and precision. Many energy consumption estimation techniques require polling a device to acquire job arrival data, and using some form of power model to describe the devices characteristics such as energy used during various states, and the energy used by a device to transition between the states. However, such an approach can produce inaccurate estimations.

Outlet-level electric meters have recently come to market for use in accurately measuring energy consumption at a device. These meters accurately measure electricity consumption at the device level, and are used for precise energy monitoring, demand/response or load shedding, and energy minimization services and solutions. Wireless electric meters can connect to a network through various wireless protocols (e.g., ZIGBEE®, WiFi, BLUETOOTH®), appearing on the network as an independent entity, i.e., the meter has no explicit connection or information about the device(s) the meter is measuring. In order for a meter to be associated with the device(s), a technician must manually associate the meter with the device(s), making this alternative expensive and time consuming.

SUMMARY

In one general respect, the embodiments disclose a method for automated association of a device and a power meter. The method includes determining a power profile for a power meter, determining device-specific power information for each of a plurality of devices, comparing the device-specific power information for each of the plurality of devices against the power profile for the power meter, determining, based upon the comparing, which of the plurality of devices is associated with the power meter, and recording the power meter and its associated device in a network management record.

In another general respect, the embodiments disclose a device including a processing device and a non-transitory computer readable medium in communication with the processing device. The computer readable medium includes one or more programming instructions for causing the processing device to determine a power profile for a power meter, determine device-specific power information for each of a plurality of print devices, compare the device-specific power information for each of the plurality of print devices against the power profile for the power meter, determine, based upon the comparison, which of the plurality of print devices is associated with the power meter, and record the power meter and its associated device in a network management record.

In another general respect, the embodiments disclose a system including a plurality of power meters, a plurality of print devices, and a computing device. The computing device includes a processing device and a non-transitory computer readable medium in communication with the processing device. The computer readable medium includes one or more programming instructions for causing the processing device to determine a power profile for each of the plurality of power meters, determine device-specific power information for each of the plurality of print devices, compare the device-specific power information for each of the plurality of print devices against each determined power profile, determine, based upon the comparison, which of the plurality of devices is associated with each of the plurality of power meters, and record each power meter and its associated device in a network management record.

DETAILED DESCRIPTION

Figure 1:
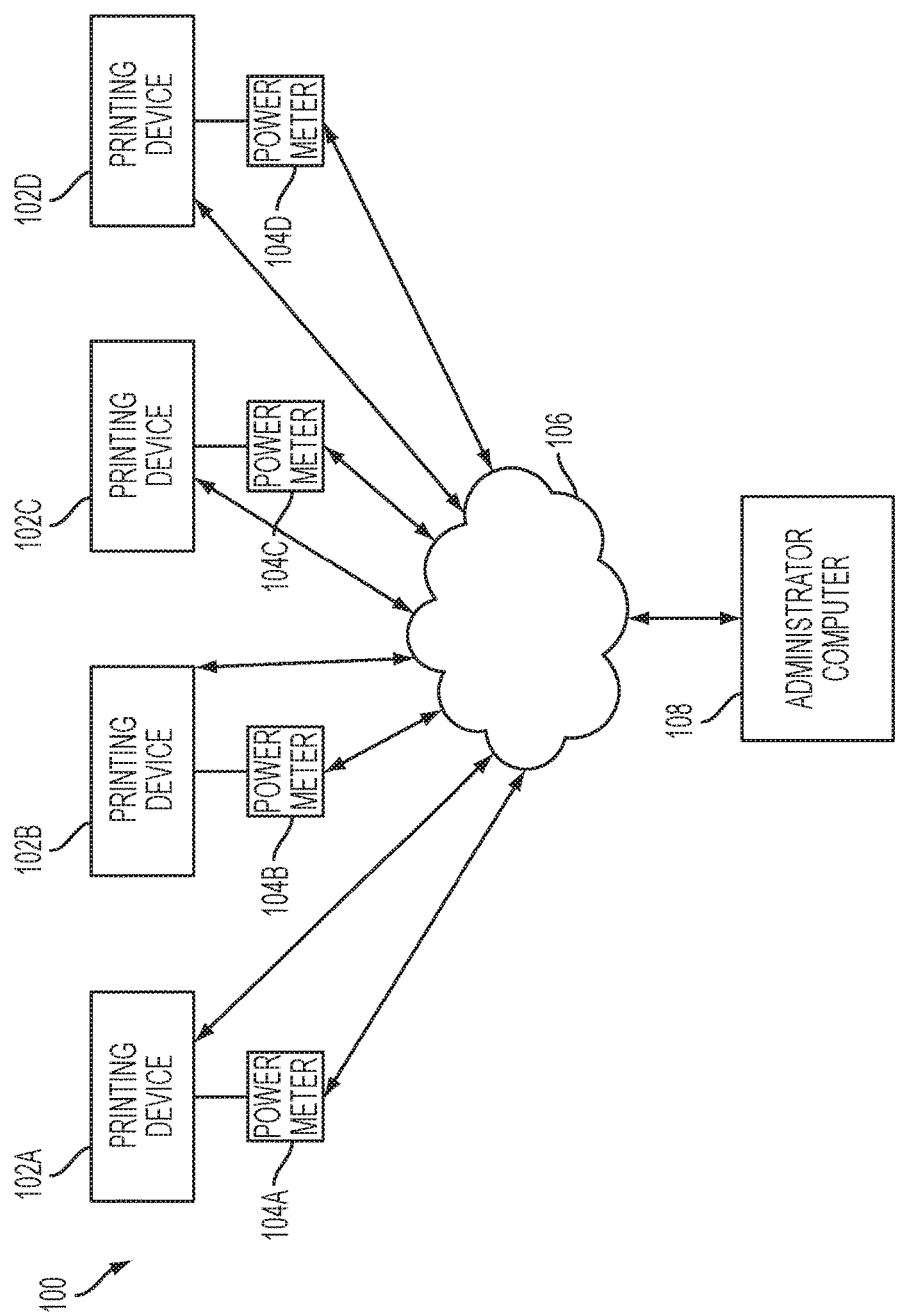
FIG. 1 depicts a sample flow diagram of a method for estimating device power consumption according to an embodiment.

This disclosure is not limited to the particular systems, devices and methods described, as these may vary. The terminology used in the description is for the purpose of describing the particular versions or embodiments only, and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

As used herein, an "asset" or a "device" refers to an electronic device configured to perform one or more specific functions. Each device has an associated power model that defines the device's power consumption during certain states as well as the device's power consumption during transitions between certain states.

A "power model" is an estimated representation of power usage for a specific device. If the device is a multifunction device configured to operate in multiple states, the power model includes power consumption levels for two or more of the multiple states as well as power consumption information for transitioning between from one state to another. A power model may be provided by the manufacturer of a device, or determined by measuring the power consumption of the device as it operates.

A "power meter" refers to an electrical component configured to measure the power consumption properties over time for one or more devices operably connected to the power meter. A power meter may be configured to operably connect to a data network via a wired or wireless connection. For example, a wireless power meter may connect to a data network via a ZIGBEE® connection, a WiFi connection, a BLUETOOTH® connection, or via another similar wireless protocol.

A "power profile" for a power meter refers to a representation of energy consumed by one or more devices associated with that power meter over a specific period of time. For example, a power profile may be a graphical representation of the energy consumed by a device operably connected to the power meter for a period of one hour. However, a graphical representation is merely shown by way of example only, and the power profile may represent energy consumption information in additional formats.

A "printing device" is an electronic device that is capable of receiving commands, and/or printing text characters and/or images on a substrate, and/or scanning images. Printing devices may include, but are not limited to, network printers, production printers, copiers and other devices using ink or toner, and scanners. A printing device may also perform a combination of functions such as printing and scanning, in which case such a device may be considered a multifunctional device.

A "computing device" or a "processing device" refers to a device that processes data in order to perform one or more functions. A computing device may include any processor-based device such as, for example, a server, a personal computer, a personal digital assistant, a web-enabled phone, a smart terminal, a dumb terminal and/or other electronic device capable of communicating in a networked environment. A computing device may interpret and execute instructions.

The present disclosure is directed to a method of automated association of an electric meter with one or more power consuming devices operably connected to that power meter. A single power meter may be long to a collection of power meters. For example, a single office building may have a collection of approximately 500 power meters, each power meter being associated with and operably connected to a single printing device. Over time, each power meter will sample instantaneous power consumption of its electrical load; i.e., the printing device operably connected to the power meter. Over a time window, traceable events, such as the arrival of a print job, will change the power consumption of the load in a predictable way.

As detailed above, in order to determine which individual device is associated with a particular power meter requires manual data input. According to the present disclosure, a power profile may be determined for the device connected to the power meter, and this power profile may be compared to historic job information for all devices to accurately match which device is associated with and connected to each power meter.

FIG. 1 depicts a sample system 100 including a plurality of printing devices and power meters. Each of printing devices 102A-102D may be operably connected to a network 106. Similarly, each of power meters 104A-104D may be operably connected to the network 106. As described above, the power meters 104A-104D may be operably connected to the network 106 via a wired or wireless connection. Depending upon the implementation of system 100, the network 106 may be a local area network such as a company intranet, or a wide area network such as the Internet.

As shown in FIG. 1, each individual device 102A-102D may be associated with a single power meter 104A-104D. For example, power meter 104A may be plugged into an electrical outlet, and device 102A may be plugged into power meter 104A such that the power meter measures any power consumed by the device. Alternatively, a power meter may be hardwired in series with a device such that any power consumed by the device is accurately measured by the power meter. Accordingly, the physical association of the power meters and the devices may vary based upon the implementation of and installation of the meters and devices.

A supervisor or administrator computer 108 may also be operably connected to the network 106 and, thus, to each of printing devices 102A-102D and power meters 104A-104D. The computer 108 may include programming instructions or software specifically created or configured to monitor the data output of each of power meters 104A-104D to accurate monitor and measure the total energy consumption of the printing devices 102A-102D over a period of time. This monitoring and measurement information may be used to improve the performance of the printing devices by better balancing the printing loads at each device. Similarly, the information may be used to reduce overall energy costs associated with the printing devices be deferring some or all of the energy consumption until a time when energy costs are reduced.

However, in order to correctly match which individual printing device is associated with an individual power meter requires additional information. In a typical implementation, there may be hundreds or thousands of individual printing devices and power meters, requiring considerable time and effort for an administrator or other service technician to manually input which printing device is associated with which power meter.

Figure 2:
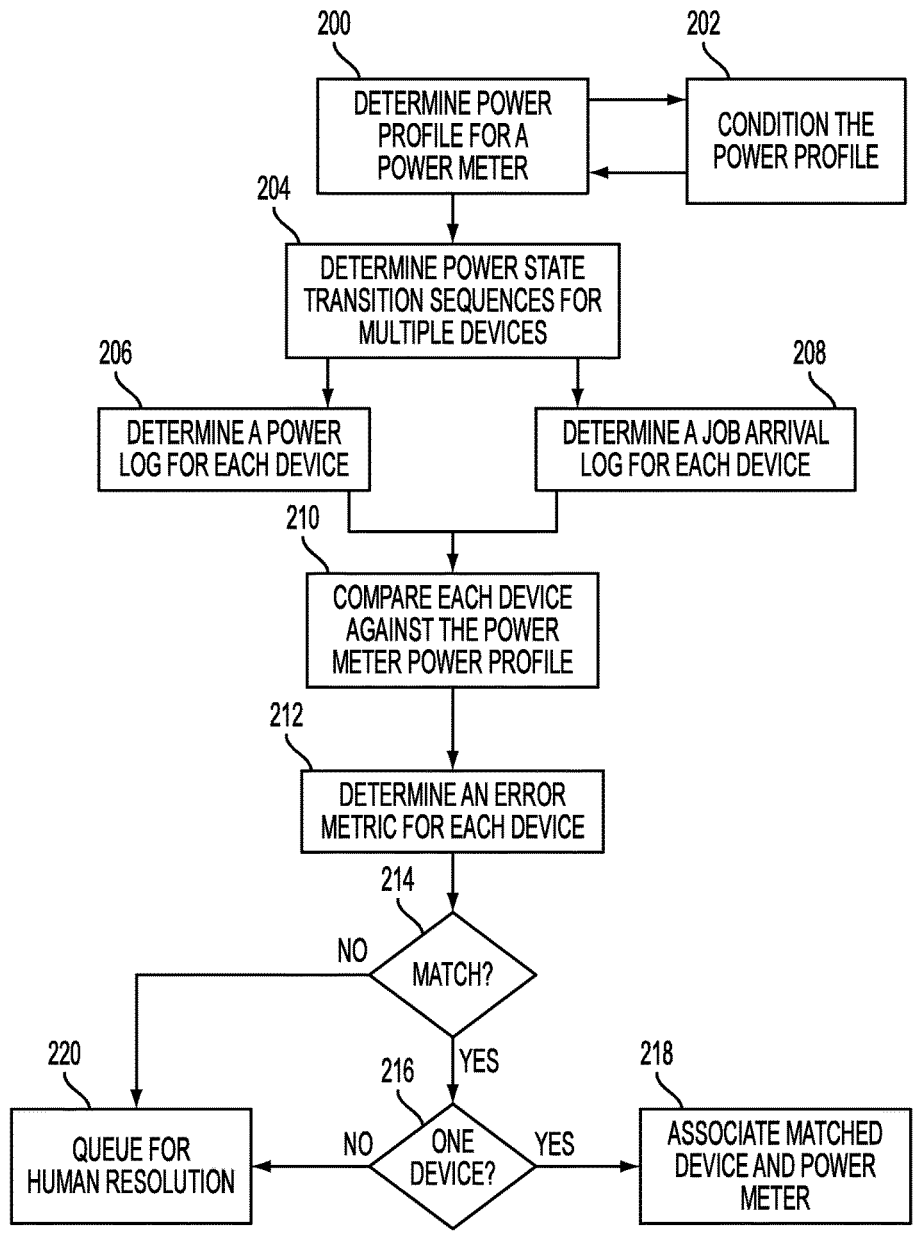
FIG. 2 depicts a sample flow diagram of a method for matching a device and an associated power meter according to an embodiment.

FIG. 2 illustrates a sample flow diagram showing a sample process for automatically matching a printing device with a power meter based upon operational information available from both the printing device and the power meter. The process as described in FIG. 2 may be implementing as one or more software modules stored on a non-transitory computer readable medium and performed by a processing device such as the processor of computer 108 as shown in FIG. 1 for performing registration and association of all power meters and devices contained within a system such as system 100.

The process as described in FIG. 2 may be run periodically to update any changes that may have occurred to the system (e.g., a new print device is added, or an existing print device is moved to a new location with a new power meter), as well as to ensure that the information previously obtained is still accurate.

Referring to FIG. 2, the processing device may determine 200 a power profile for each power meter. In order to determine 200 the power profile, the processing device may receive, from a power meter, information related to energy consumed by a device associated with the power meter for a specific period of time. For example, as shown in FIG. 3A, this information may include a time-based plot of power consumed by the device and measured by the power meter.

Figure 3A:
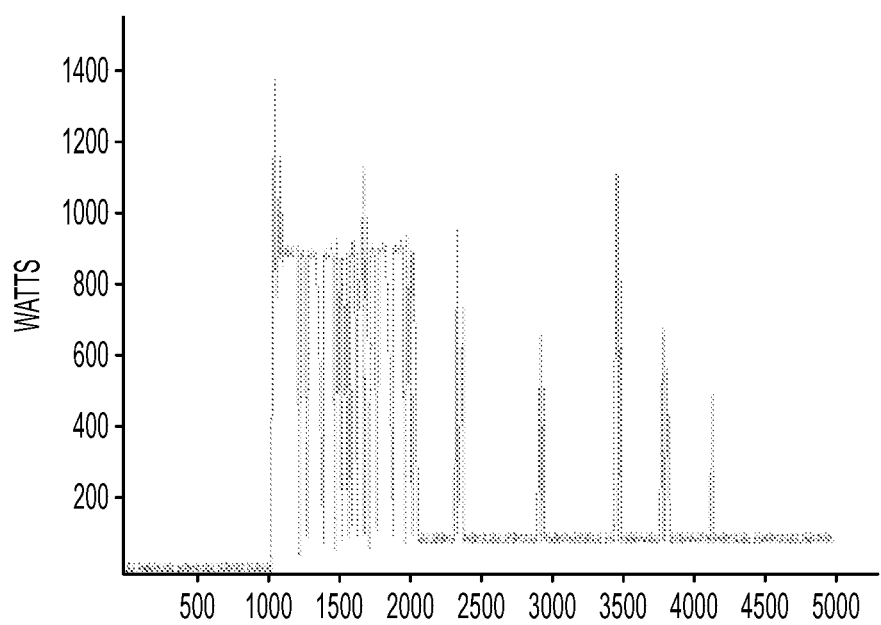
FIG. 3A depicts a power profile as received from a power meter according to an embodiment.

As shown in the example of FIG. 3A, the device associated with the power meter is using relatively low power until about time 100, where the power consumed spikes briefly to about 1400 watts, and then settles around 900 watts until about time 2000.

Optionally, the processing device may condition 202 the power profile. Conditioning 202 the power profile may include manipulation of the data contained within the power profile to produce additional representations or views of the data. Similarly, conditioning 202 the power profile may include inferring additional information related to the power profile, and updating or revising the power profile to represented the additional or inferred information.

Figure 3B:
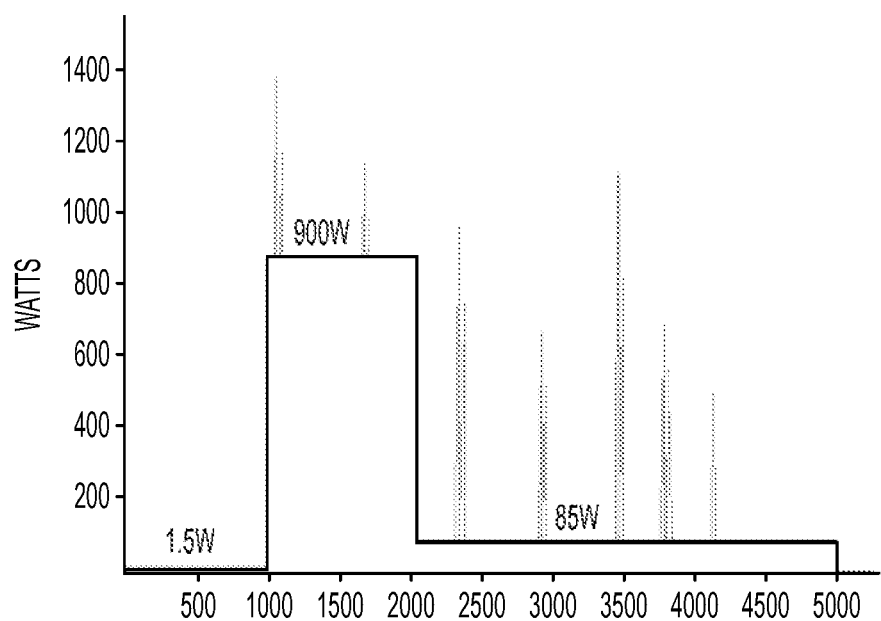
FIG. 3B depicts a conditioned power profile according to an embodiment.

For example, during conditioning 202, the processing device may analyze the time-based power plot to infer various power state transitions, and average the power levels for each determined power state during the observed period of time. FIG. 3B illustrates an example of a conditioned power profile. As shown in FIG. 3B, a power state transitions have been added, as well as average power levels for each of the inferred power states. For example, as shown in FIG. 3B, the device was in a low power state having an average power of 1.5 watts between time 0 and time 1000. At about time 1000, the device transitioned to a higher power state where the average power consumed was about 900 watts. Then, at about time 2000, the device transitioned to a lower power state where an average of about 85 watts was consumed until the end of the observed time. As shown in FIG. 3B, the inferred power states may be overlaid on the time-based power plot (as shown in FIG. 3A), however, this is shown by way of example and the inferred power state graph may be created without the time-based power plot as well.

The processing device may also determine 204 device specific power information such as power state transition sequences for each of a plurality of devices contained within the system as well. This determination 204 may be performed a single time, and the information reused during as each power meter in the system is associated with a device. Conversely, the determination 204 may be performed again as each power meter is associated with a device, depending on the timing requirements of the system and the processing capabilities of the processing device performing the association.

Figure 4A:
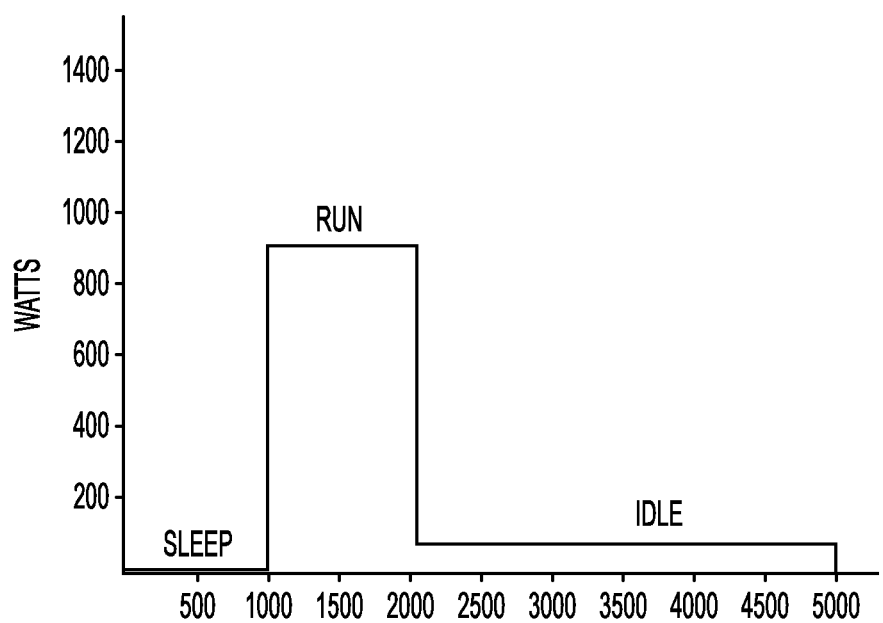
FIG. 4A depicts a power log for a printing device according to an embodiment.

To determine 204 the power state transition sequences for each of the devices, the processing device may determine 206 a power log for each device. The power log may be based upon historic operational data for the device, as well as the device's associated power model. As shown in FIG. 4A, a power log may be determined for a device that was initially in a sleep mode until about time 1000, transitioned to a run mode at about time 1000, and then transitioned to an idle mode at about time 2000. Based upon the associated power model for the device, it may be determined that the device uses about 2 watts during sleep mode, about 940 watts during run mode, and about 80 watts during idle mode. It should be noted a power model is typically standardized for a model of device, and individual devices may vary slightly from their power model during actual use.

Figure 4B:
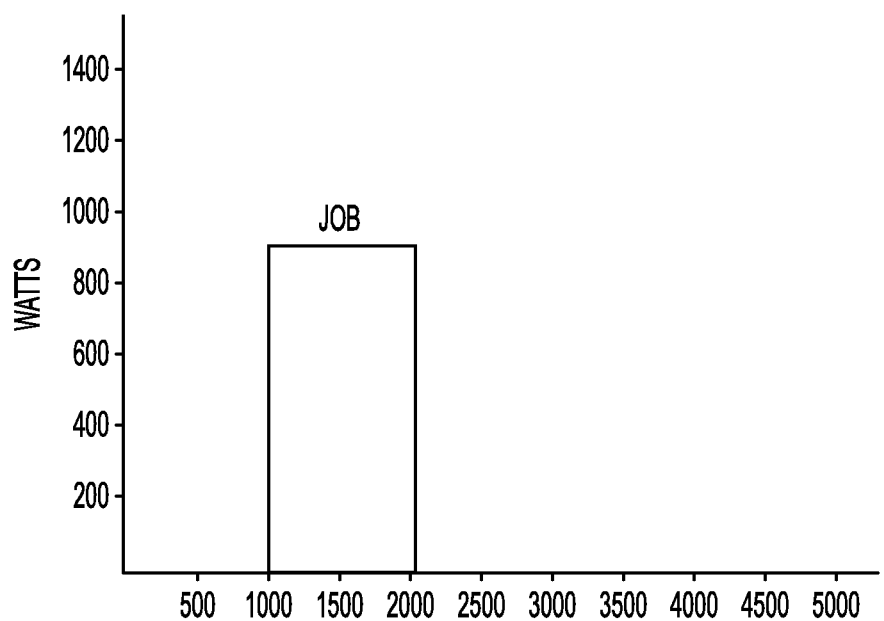
FIG. 4B depicts a job arrival log for a printing device according to an embodiment.

Alternatively or additionally, the processing device may also determine 208 a job arrival log for each device. Like the power log, the job arrival log may be based upon historic operational data for the device, including a listing of when a job was sent to the device and how long the device took to process the job. As shown in FIG. 4B, a job arrival log may show when a job was received (about time 1000) and how long the job took to process (until about time 2000). However, the job arrival log as shown in FIG. 4B may be limited to only when a job is received and how long the job took to process, without including additional information about that the device was doing prior to or after processing the job.

As shown in FIG. 2, determining 206 the power log for each device and determining 208 the job arrival log for each device are shown as being concurrent steps. However, this is merely by way of example only, and the determining 206, 208 may be performed in any order according to the implementation and operation of the process as described herein.

Referring again to FIG. 2, the processing device may determine 204 the power state transition sequences for each of the plurality of devices based upon one or both of the power log and the job arrival log for each device. In order to determine 204 the power state transition sequence, the processing device may infer various information based upon information contained within the power log, job arrival log, power model, and any other data related to the operation of the device. For example, the processing device may infer power state transitions and average power used by the device based upon the power log, as well as transition costs, timeouts, power mode states, and other information from the power model.

Figure 4C:
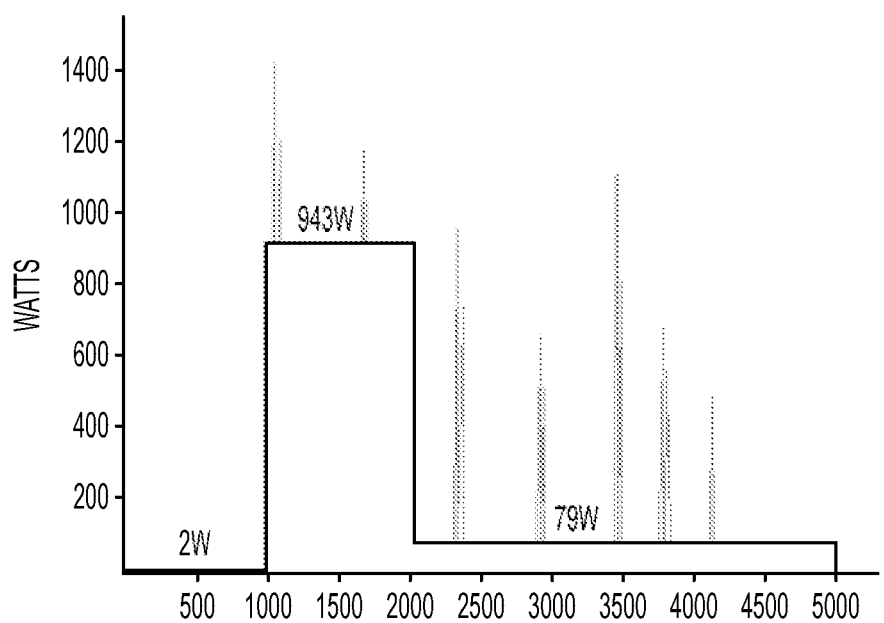
FIG. 4C depicts an inferred power profile for a printing device according to an embodiment.

Using this information, the processing device may determine 204 the power state transition sequence for each device. An example of a power state transition sequence is shown in FIG. 4C. Based upon the information available, the processing device may infer the average power associated with each state, as well as transitions associated with transitioning between states as well as costs associated with timeouts and other interruptions.

In order to associate an individual device with the power meter being analyzed, the processing device may compare 210 the determined (and/or inferred) device-specific power information for each device against the power profile for the power meter. For example, this may include comparing 210 the power state transition sequences for each device against the conditioned power profile for the power meter. Prior to comparing, the processing device may synchronize the power state transition sequences and the power profile for the power meter so that the timing for each is uniform. Existing timing synchronization techniques current used in energy monitoring may be used to synchronize the devices and the power meter.

The processing device may also use a common statistical comparison technique such as the sum of the square differences between the signals to quantify the differences between each of the power state transition sequences and the conditioned power profile for the power meter. For example, the processing device may overlay each power state transition sequence on the conditioned power profile, and compare 210 the sum of the square differences between the two graphs. The processing device may then determine 212 an error metric or value for each device based upon the result of the comparison 210. For example, comparing the power profile as shown in FIG. 3B and the power state transition sequence as shown in FIG. 4C would result in a low error value as the two graphs are similar is shape and structure.

The processing device may then determine 214 whether there is a specific device in the plurality of devices compared that matches the power meter by determining whether the error value for each device is within an acceptable threshold. If there are no devices that match 214 within the acceptable threshold, the power meter association process may terminate, and an error message related to the power meter may be queued 220 for human resolution at a later time.

If the processing device does determine 214 there is a match, the processing device may further determine 216 whether there is only one device that is within the acceptable threshold. If there is only one device that is within the acceptable threshold, the matched device and the power meter may be associated 218 together, and an electronic record such as a database or other similar structure may be automatically updated to reflect that the matched device and the power meter are operably connected together. Then, during power consumption monitoring, any records associated with that specific power meter are attributed to its matched device.

Alternatively, in order to avoid having multiple possible matched devices, the processing device may associate the device with the lowest overall error score with the power meter, thereby eliminating the use of the threshold. This may eliminate potential correct matches from being overlooked due to small calculating or processing faults that increase the error value for a device above the threshold. For example, an internal time associated with the power meter may be malfunctioning, resulting in the timing of the power profiles being skewed for that power meter. However, as this error would be universal across all devices (i.e., it would impact all devices identically), removing the threshold may still result in the correct device being associated with the malfunctioning power meter, even with a higher error value.

The process as shown in FIG. 2 may be repeated for each power meter contained within a system. For example, in the system 100 as shown in FIG. 1, the process as shown in FIG. 2 would be performed at least four times, one for each of power meters 104A-104D. After completion of the associating processes, a record associated with the system 100 should indicate that device 102A is operably connected to power meter 104A, device 102B is associated with power meter 104B, device 102C is associated with power meter 104C, and device 102D is associated with power meter 104D, all without any requiring human interaction and verification of which device is connected to which power meter. Thus, as the processes and techniques described herein are applied to a system including thousands of power meters and associated devices, the time and human resource savings increase dramatically.

Figure 5:
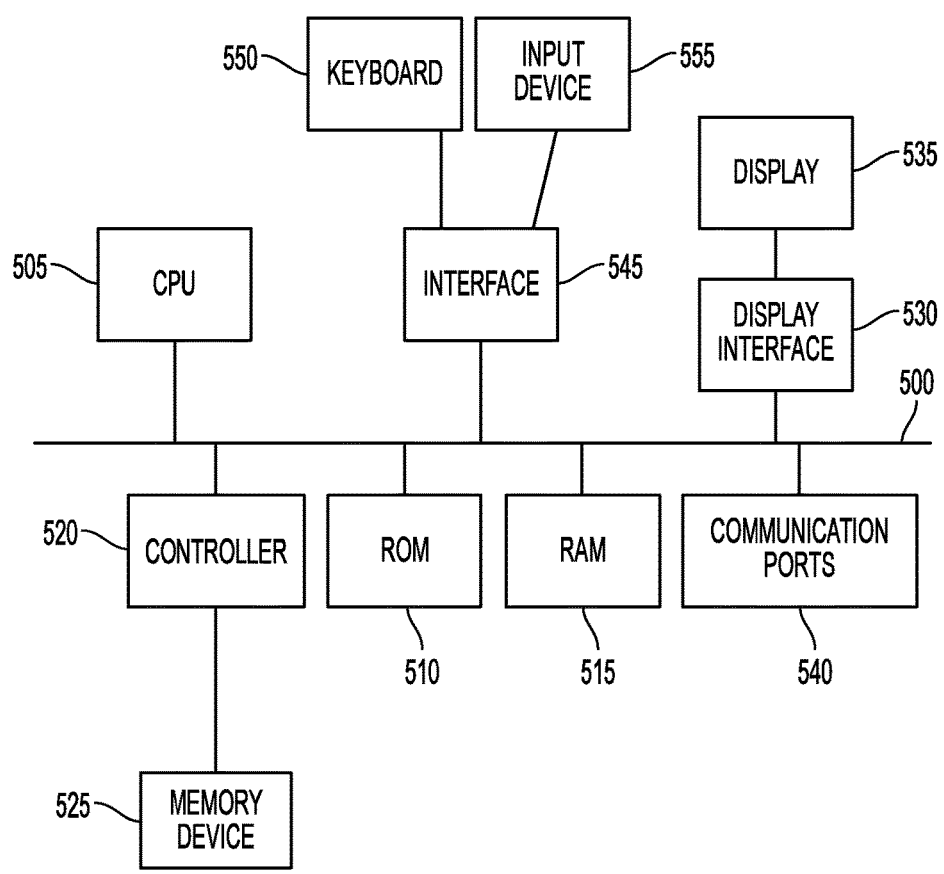
FIG. 5 depicts various embodiments of a computing device for implementing the various methods and processes described herein.

FIG. 5 depicts a block diagram of internal hardware that may be used to contain or implement the various methods and processes as discussed above. For example, computer 108 as shown in FIG. 1 may include similar internal hardware as that illustrated in FIG. 5. An electrical bus 500 serves as the main information highway interconnecting the other illustrated components of the hardware. CPU 505 is the central processing unit of the system, performing calculations and logic operations required to execute a program. For example, CPU 505 may perform the functions performed by the processing device in the above discussion of FIG. 2. CPU 505, alone or in conjunction with one or more of the other elements disclosed in FIG. 5, is a processing device, computing device or processor as such terms are used within this disclosure. Read only memory (ROM) 510 and random access memory (RAM) 515 constitute examples of memory devices.

A controller 520 interfaces with one or more optional memory devices 525 to the system bus 500. These memory devices 525 may include, for example, an external or internal DVD drive, a CD ROM drive, a hard drive, flash memory, a USB drive or the like. As indicated previously, these various drives and controllers are optional devices. Additionally, the memory devices 525 may be configured to include individual files for storing any software modules or instructions, auxiliary data, incident data, common files for storing groups of contingency tables and/or regression models, or one or more databases for storing the information as discussed above.

Program instructions, software or interactive modules for performing any of the functional steps associated with the processes as described above may be stored in the ROM 510 and/or the RAM 515. Optionally, the program instructions may be stored on a tangible computer readable medium such as a compact disk, a digital disk, flash memory, a memory card, a USB drive, an optical disc storage medium, such as a BLU-RAY™ disc, and/or other recording medium.

An optional display interface 530 may permit information from the bus 500 to be displayed on the display 535 in audio, visual, graphic or alphanumeric format. Communication with external devices may occur using various communication ports 540. A communication port 540 may be attached to a communications network, such as the Internet or a local area network.

The hardware may also include an interface 545 which allows for receipt of data from input devices such as a keyboard 550 or other input device 555 such as a mouse, a joystick, a touch screen, a remote control, a pointing device, a video input device and/or an audio input device.

It should be noted that printing devices as described above used in combination with the power meters are provided by way of example only. The techniques and processes as taught herein may be applied to additional devices that have varying levels of power consumption based upon their state of operation. Additionally, the power meter devices being shown electrically in line with the devices being monitored is shown by way of example only as well, and alternative embodiments may be used. For example, the power meter may be integrated into a circuit breaker or other device commonly installed in an electrical system to monitor the power consumption of a device. However, the identification and association techniques as described herein would apply to such an alternative scenario.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:

1. A method for automated association of a power consuming device and a power meter, the method comprising:
   in a system that comprises a plurality of power meters and a plurality of power consuming devices, wherein each of the plurality of power consuming devices is operably connected to a respective one of the plurality of power meters:
      by each power meter, measuring power consumed by an operably connected one of the plurality of power consuming devices;
      by a processing device:
         receiving, from each power meter, information relating to the power consumed by the power meter's operably connected power consuming device;
         determining a power profile for each power meter based on the power consumed by the power meter's operably connected power consuming device for a specific period of time;

determining device-specific power information for each of the plurality of power consuming devices by determining:
- a power state transition sequence for each of the power consuming devices, wherein the power state transition sequence for each of the power consuming devices comprises a power log that is based on historic operational data of the power consuming device, and
- a job arrival log for each of the power consuming devices, wherein the job arrival log shows when jobs were received and how long each job took to process;

comparing, by the processing device, the device-specific power information for each of the power consuming devices against the power profiles for each of the power meters;

based upon the comparing, automatically determining, by the processing device, which of the plurality of power consuming devices is associated with which of the plurality of power meters; and recording, by the processing device, each power meter and its associated power consuming device in a network management record.

2. The method of claim 1, wherein the power state transition sequence for each of the plurality of power consuming devices is inferred based upon information contained within both the power log and the job arrival log for each of the plurality of power consuming devices.

3. The method of claim 2, wherein the device-specific power profile for each of the plurality of power consuming devices is determined based upon the inferred power state transition sequence for each of the power consuming devices.

4. The method of claim 1, wherein determining the power profile for each power meter comprises:
receiving, from each power meter, information related to energy consumed by a respective power consuming device associated with each power meter; and
conditioning the information into a power profile associated with each power meter.

5. A device comprising:
a processing device; and
a non-transitory computer readable medium in communication with the processing device, the computer readable medium comprising one or more programming instructions for causing the processing device to:
determine a power profile for each of a plurality of power meters that are electrically connected to a respective one of a plurality of print devices,
determine device-specific power information for each of the plurality of print devices by determining:
- a power state transition sequence for each of the power consuming print devices, wherein the power state transition sequence for each of the power consuming print devices comprises a power log that is based on historic operational data of the power consuming print device; and
- a job arrival log for each of the power consuming print devices, wherein the job arrival log shows when jobs were received and how long each job took to process, compare the device-specific power information for each of the plurality of print devices against the power profiles for each of the plurality of power meters, based upon the comparison, determine which of the plurality of print devices is electrically connected to a respective one of the plurality of power meters, and
record each power meter and its associated print device in a network management record..

6. The device of claim 5, wherein the power state transition sequence is inferred based upon information contained within both the power log and the job arrival log for each of the print devices.

7. The device of claim 6, wherein the device-specific power profile for each of the print devices is determined based upon the inferred power state transition sequence for each of the print devices.

8. The device of claim 5, wherein the one or more instructions for determining the power profile for each power meter further comprise instructions for causing the processing device to:
receive, from each power meter, information related to energy consumed by a respective print device associated with each power meter; and
condition the information into a power profile associated with each power meter.

9. A system comprising:
a plurality of power meters;
a plurality of print devices, wherein each of the plurality of print devices is electrically coupled to a respective one of the plurality of power meters so that the power meters measure power consumed by each of the plurality of print devices; and
a computing device comprising:
a processing device, and
a non-transitory computer readable medium in communication with the processing device, the computer readable medium comprising one or more programming instructions for causing the processing device to:
determine a power profile for each of the plurality of power meters based on power consumed by an electrically coupled one of the plurality of print devices,
determine device-specific power information for each of the plurality of print devices by determining:
- a power state transition sequence for each of the power consuming print devices, wherein the power state transition sequence for each of the power consuming print devices comprises a power log that is based on historic operational data of the power consuming print device; and
- a job arrival log for each of the power consuming print devices, wherein the job arrival log shows when jobs were received and how long each job took to process, compare the device-specific power information for each of the plurality of print devices against each determined power profile,
based upon the comparison, determine which of the plurality of print devices is associated with which of the plurality of power meters, and
record each power meter and its associated print device in a network management record.

10. The system of claim 9, wherein the power state transition sequence is inferred based upon information contained within both the power log and the job arrival log for each of the plurality of print devices.

11. The system of claim 10, wherein the device-specific power profile for each of the plurality of print devices is determined based upon the inferred power state transition sequence for each of the print devices.

12. The system of claim 9, wherein the one or more instructions for determining the power profile for each power meter further comprise instructions for causing the processing device to:
- receive, from each power meter, information related to energy consumed by a respective print device associated with each power meter; and
- condition the information into a power profile associated with each power meter.

\* \* \* \* \*